US012805279B2

(12) United States Patent
Byun et al.

(10) Patent No.: US 12,805,279 B2
(45) Date of Patent: Nov. 17, 2026

(54) SYSTEMS AND METHODS FOR CLEANING AND TREATING A SURFACE OF A SUBSTRATE

(71) Applicant: ASM IP Holding B.V., Almere (NL)

(72) Inventors: YoungChol Byun, Tempe, AZ (US); Moataz Bellah Mousa, Chandler, AZ (US); Dong Li, Phoenix, AZ (US); Arul Vigneswar Ravichandran, Tempe, AZ (US); Yasiel Cabrera, Phoenix, AZ (US); Salvatore Luiso, Tempe, AZ (US)

(73) Assignee: ASM IP Holding B.V., Almere (NL)

(*) Notice: Subject to any disclaimer, the term of this patent is extended or adjusted under 35 U.S.C. 154(b) by 912 days.

(21) Appl. No.: 18/147,038

(22) Filed: Dec. 28, 2022

(65) Prior Publication Data

US 2023/0215763 A1 Jul. 6, 2023

Related U.S. Application Data

(60) Provisional application No. 63/295,679, filed on Dec. 31, 2021.

(51) Int. Cl.

| | |
|---|---|
| ***H10W 20/00*** | (2026.01) |
| ***C23C 16/02*** | (2006.01) |
| ***C23C 16/08*** | (2006.01) |
| ***C23C 16/34*** | (2006.01) |
| ***C23C 16/56*** | (2006.01) |
| ***H10P 70/00*** | (2026.01) |

(52) U.S. Cl.

CPC ....... *H10W 20/057* (2026.01); *C23C 16/0227* (2013.01); *C23C 16/08* (2013.01); *C23C 16/34* (2013.01); *C23C 16/345* (2013.01); *C23C 16/56* (2013.01); *H10P 70/27* (2026.01); *H10W 20/056* (2026.01)

(58) Field of Classification Search

CPC ..... C23C 16/02; C23C 16/0227; C23C 16/04; C23C 16/045; C23C 16/06; C23C 16/08; C23C 16/303; C23C 16/34; C23C 16/56; H10P 70/00; H10P 70/234; H10P 70/27; H10W 20/00; H10W 20/056; H10W 20/057; H10W 20/081

See application file for complete search history.

(56) References Cited

U.S. PATENT DOCUMENTS 8,025,922 B2 9/2011 Haukka
9,449,843 B1 9/2016 Korolik
(Continued)

FOREIGN PATENT DOCUMENTS

JP 2016167545 A * 9/2016 ........ H10W 20/0552

*Primary Examiner* — Brook Kebede
(74) *Attorney, Agent, or Firm* — Snell & Wilmer L.L.P.

(57) ABSTRACT

Methods and systems for cleaning and treating a surface of a substrate. An exemplary method includes providing a substrate comprising a gap comprising a metal oxide and a dielectric material within a reaction chamber, and using a thermal process to selectively remove the metal oxide. Exemplary methods can further include a step of depositing a metal-containing material within the gap to at least partially fill the gap and using a direct plasma and treating a surface of the metal-containing material to remove oxygen from the surface of the metal-containing material. Exemplary systems can perform the methods.

17 Claims, 7 Drawing Sheets

(56) References Cited

U.S. PATENT DOCUMENTS

| | | | | |
|---|---|---|---|---|
| 11,295,980 | B2 | 4/2022 | Zope | |
| 2007/0099806 | A1* | 5/2007 | Stewart | C11D 7/08<br>257/E21.165 |
| 2019/0273019 | A1* | 9/2019 | Mullick | H10W 20/069 |
| 2021/0285102 | A1* | 9/2021 | Yoon | C23C 16/45534 |

* cited by examiner

SYSTEMS AND METHODS FOR CLEANING AND TREATING A SURFACE OF A SUBSTRATE

CROSS-REFERENCE TO RELATED APPLICATIONS

This application is a nonprovisional of, and claims priority to and the benefit of, U.S. Provisional Patent Application No. 63/295,679, filed Dec. 31, 2021 and entitled "SYSTEMS AND METHODS FOR CLEANING AND TREATING A SURFACE OF A SUBSTRATE," which is hereby incorporated by reference herein.

FIELD OF INVENTION

The present disclosure generally relates to methods and systems used in the formation of electronic devices. More particularly, the disclosure relates to methods and systems suitable for at least partially filling gaps on a surface of a substrate during the manufacture of electronic devices.

BACKGROUND OF THE DISCLOSURE

Gas-phase reactors, such as chemical vapor deposition (CVD) reactors, atomic layer deposition (ALD) reactors, and the like, can be used for a variety of applications, including depositing and etching materials on a substrate surface, and cleaning and treating a surface of the substrate. For example, gas-phase reactors can be used to deposit layers on a substrate to form devices, such as semiconductor devices and the like.

During the manufacture of semiconductor devices, it can be desirable to fill gaps on a surface of a substrate with conductive material, such as metal. While techniques have been developed to provide material within a gap, typical techniques often employ substrate surface cleaning with radical-based etching to remove metal oxides from the substrate prior to depositing metal-containing materials. Such surface cleaning often results in surface damage to an underlying layer, such as a dielectric layer. The surface damage to the dielectric layer can result in void formation in a structure. The presence of such voids can result in a structure with undesirably higher resistivity.

Further, after depositing metal-containing materials on the substrates, a layer of oxidized material can form on the surface of the metal-containing material. This layer of oxidized material can also result in a higher than desired resistivity of the structure.

Accordingly, improved methods and systems for forming structures, particularly, to filling gaps with conductive material are desired.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods and systems for providing material within a gap—e.g., at least partially filling the gap with desired material. Additionally, various embodiments of the disclosure relate to a structure formed by the exemplary methods and systems disclosed. As set forth in more detail below, exemplary methods include providing a substrate with a first surface, cleaning the first surface, depositing a metal-containing material, and treating a surface of the metal-containing material. Exemplary methods may not include all of these steps and/or may include additional steps.

In accordance with various embodiments of the disclosure, a method of forming a structure is provided. Exemplary methods include providing a substrate within a reaction chamber, the substrate can comprise a gap. The gap can comprise a first surface at a bottom of the gap comprising a metal oxide. The gap can further comprise a second surface at a sidewall of the gap comprising a dielectric material. The method of forming a structure can further comprise using a thermal process, cleaning the first surface using a metal halide reactant to selectively remove the metal oxide.

In accordance with examples of embodiments, the step of cleaning the first surface can further comprise exposing the first surface to one or more of a hydrogen-containing gas and an activated species formed therefrom. In accordance with examples of embodiments, the method of forming the structure can further comprise depositing a metal-containing material within the gap to at least partially fill the gap. The metal-containing material can comprise at least one of titanium nitride, molybdenum, ruthenium, tungsten and titanium silicon nitride (TiSiN).

In accordance with examples of embodiments, the metal oxide can comprise at least one of tungsten oxide, molybdenum oxide, titanium oxide, titanium silicon oxide (TiSiOx), and titanium silicon oxynitride (TiSiONx). In accordance with examples of embodiments, the dielectric material can comprise at least one of silicon oxide, silicon nitride, and silicon oxynitride, silicon oxycarbide (SiOC) and SiOCH. In accordance with examples of embodiments, the method can further comprise treating a surface of the metal-containing material to remove oxygen from the surface of the metal-containing material via a direct plasma treatment. Exemplary methods of using the direct plasma treatment can comprise providing a hydrogen and nitrogen-containing gas to the reaction chamber.

In accordance with additional embodiments of the disclosure, another method of forming a structure is provided. In accordance with these examples, exemplary methods include providing a substrate within a reaction chamber, the substrate can comprise a gap. The gap can comprise a first surface at a bottom of the gap comprising a metal oxide. The gap can further comprise a second surface at a sidewall of the gap comprising a dielectric material. In accordance with various embodiments, the method of forming a structure can further comprise depositing a metal-containing material within the gap to at least partially fill the gap. In accordance with examples of embodiments, the method can further comprise treating a surface of the metal-containing material to remove oxygen from the surface of the metal-containing material.

In accordance with examples of embodiments, the step of depositing the metal-containing material can comprise depositing the metal-containing material at a temperature between 300° C. and 550° C. The metal-containing material can comprise at least one of titanium nitride, molybdenum, and ruthenium, tungsten and titanium silicon nitride (TiSiN). In accordance with examples of embodiments, the bottom of the gap can comprise a metal oxide selected from the group consisting of tungsten oxide, molybdenum oxide, titanium oxide, TiSiOx and TiSiONx. In accordance with examples of embodiments, the sidewall of the gap can comprise a dielectric material selected from the group consisting of silicon oxide, silicon nitride, and silicon oxynitride, SiOC and SiOCH In accordance with examples of embodiments, the step of treating can comprise applying a direct plasma treatment and/or providing a hydrogen and nitrogen-containing gas to the reaction chamber. The hydrogen and nitrogen-containing gas can be selected from the group consisting of one or more of a mixture of hydrogen and nitrogen, ammonia, hydrazine, an alkyl hydrazine. The step of treating can comprise a cyclic process comprising pulsing a metal halide to the reaction chamber. The step of pulsing the metal halide to the reaction chamber can be a thermal process.

In accordance with examples of embodiments, the method of forming a structure can further comprise a step of cleaning the first surface—e.g., using a cleaning process as described herein. In accordance with examples of embodiments, the metal-containing material can comprise at least one of titanium nitride, molybdenum, ruthenium, tungsten and titanium silicon nitride (TiSiN). In accordance with examples of embodiments, the first surface of the bottom of the gap can comprise a metal oxide. The metal oxide can be selected from the group consisting of tungsten oxide, molybdenum oxide, titanium oxide, TiSiOx and TiSiONx. In accordance with examples of embodiments, the sidewall of the gap can comprise a dielectric material. The dielectric material can be selected from the group consisting of silicon oxide, silicon nitride silicon oxynitride, SiOC and SiOCH In accordance with additional embodiments of the disclosure, a system for filling a gap on a surface of a substrate is provided. An exemplary system can include a precursor source comprising a precursor for deposition and a reactant source comprising a metal halide reactant. The system can further comprise a controller configured to operate flow control valves to provide the precursor from the precursor source and the metal halide reactant from the reactant source. In examples of embodiments, the system further comprises a reaction chamber coupled to the precursor source and the reactant source, and responsive to the flow control valves. The reaction chamber can be configured to receive the substrate including the gap comprising a first surface at a bottom of the gap comprising a metal oxide, and a second surface at a sidewall of the gap comprising a dielectric material. The reaction chamber can be configured to receive the metal halide reactant to selectively remove the metal oxide via a thermal process. The reaction chamber can also be configured to receive the precursor to deposit a metal-containing material, wherein the metal-containing material is deposited within the gap to at least partially fill the gap. Additionally, the reaction chamber can be configured to apply a direct plasma treatment to remove oxygen from a surface of the metal-containing material.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
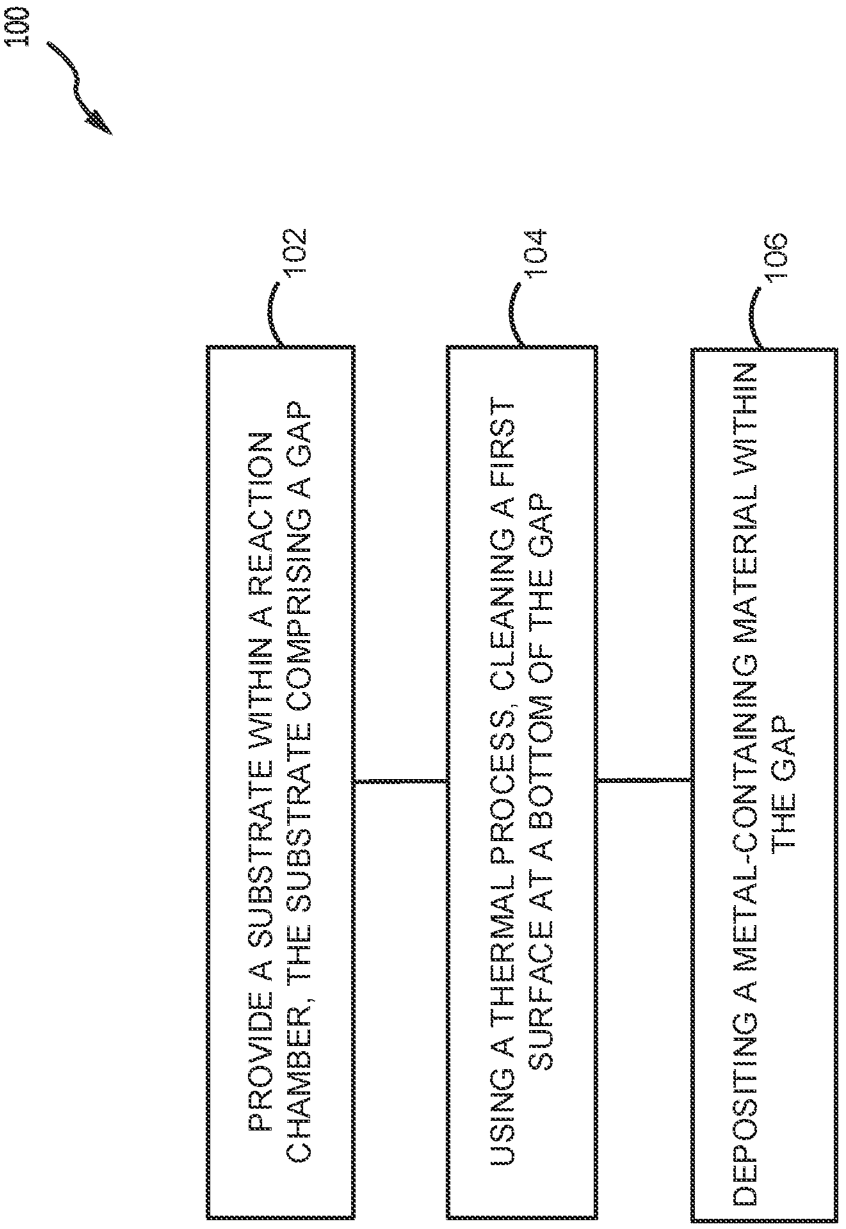
FIG. 1 illustrates a method of forming a structure in accordance with exemplary embodiments of the disclosure.

It will be appreciated that elements in the figures are illustrated for simplicity and clarity and have not necessarily been drawn to scale. For example, the dimensions of some of the elements in the figures can be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming structures, to systems for forming structures, and to structures formed according to a method or using the system. As set forth in more detail below, exemplary method include cleaning a surface prior to deposition, depositing material, and treating the deposited material. In some cases, exemplary methods can include the cleaning or treating step or both the cleaning and treating steps.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of example, a substrate can include bulk semiconductor material and an insulating or dielectric material layer overlying at least a portion of the bulk semiconductor material.

As used herein, a "structure" can be or can include a substrate as described herein. Structures can include one or more layers overlying the substrate, such as one or more layers formed according to a method as described herein.

In this disclosure, any two numbers of a variable can constitute a workable range of the variable, and any ranges indicated can include or exclude the endpoints. Additionally, any values of variables indicated (regardless of whether they are indicated with "about" or not) can refer to precise values or approximate values and include equivalents, and can refer to average, median, representative, majority, etc. in some embodiments. Further, in this disclosure, the terms "including," "constituted by" and "having" can refer independently to "typically or broadly comprising," "comprising," "consisting essentially of" or "consisting of" in some embodiments. In this disclosure, any defined meanings do not necessarily exclude ordinary and customary meanings in some embodiments.

Figure 4:
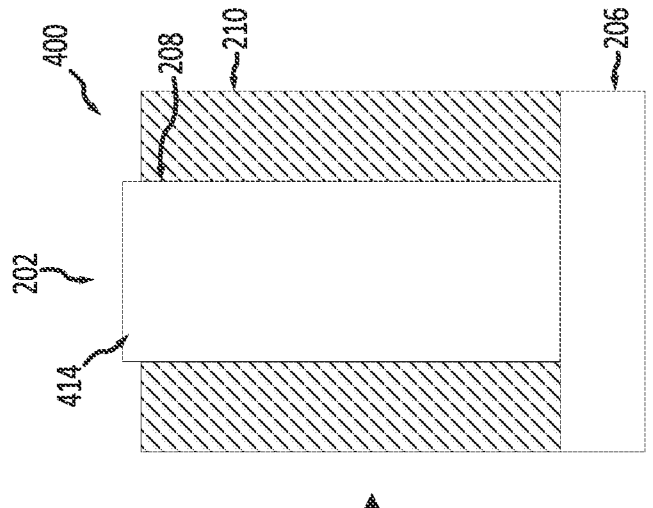
FIGS. 2-4 illustrate cross sectional views of structures at various steps of a gap filling process in accordance with exemplary embodiments of the disclosure.
Figure 3:
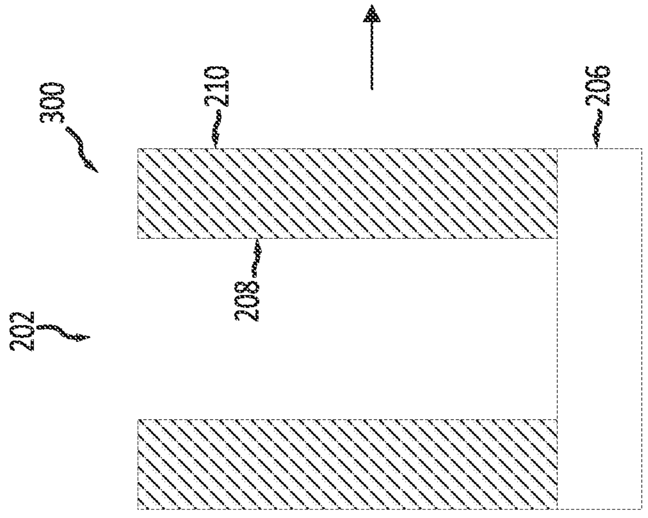
Figure 2:
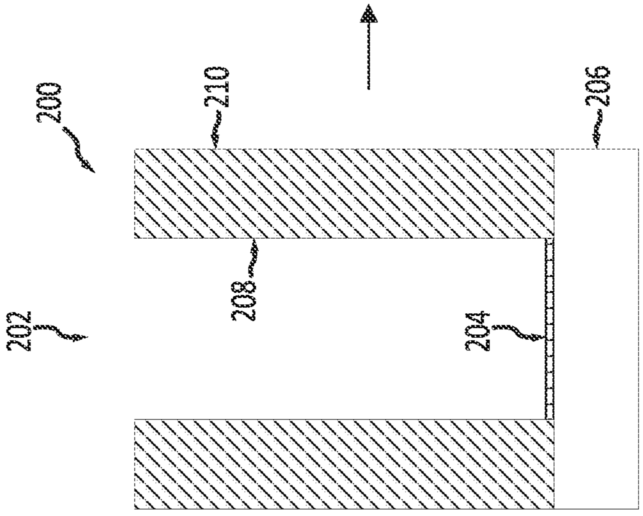

Turning now to the figures, FIG. 1 illustrates an exemplary method 100 for forming a structure according to an embodiment of the present disclosure. FIGS. 2-4 illustrate cross-sectional views of structures at stages of method 100. Method 100 can begin with step 102, which can involve providing a substrate (such as substrate 200, illustrated in FIG. 2) within a reaction chamber.

The substrate 200 can be a structure. The substrate 200 can comprise a gap (such as gap 202). The gap 202 can comprise a first surface (such as first surface 204) at a bottom of the gap (such as bottom 206) and a second surface (such as second surface 208) at a sidewall of the gap (such as sidewall 210).

The first surface 204 of the bottom of the gap 206 can comprise a metal oxide. The metal oxide can comprise at least one of tungsten oxide, molybdenum oxide, titanium oxide, TiSiOx and TiSiONx. In some cases, the metal oxide includes a native metal oxide.

The bottom of the gap 206 can comprise a metal. The metal can comprise at least one of tungsten, molybdenum, titanium, ruthenium, tungsten, and titanium silicon nitride (TiSiN).

The second surface 208 of the sidewall of the gap 210 can comprise a dielectric material. The dielectric material can comprise at least one of silicon oxide, silicon nitride, silicon oxynitride, SiOC, and SiOCH During step 102 the reaction chamber can be brought to a desired pressure and/or temperature for subsequent processing. For example, the reaction chamber or a susceptor therein can be at a temperature between about 200° C. and about 600° C. or between about 300° C. and about 500° C. A pressure within the reaction chamber can be between about 1 and about 90 torr or about 10 torr and about 70 torr.

With reference again to FIG. 1 and to FIG. 3, method 100 includes a step 104 of using a thermal process, cleaning the first surface 204 at a bottom of the gap 206 of substrate 200 to form a structure (such as structure 300, illustrated in FIG. 3).

An exemplary thermal process includes using a metal halide reactant to selectively remove the metal oxide from the first surface 204. The metal halide reactant can comprise at least one of tungsten pentachloride, molybdenum pentachloride, and molybdenum tetrachloride.

The thermal process can comprise thermal etching the first surface 204 by pulsing the metal halide reactant within the reaction chamber. A duration of a metal halide reactant pulse during step 104 can be about 50 ms to about 60 s or about 0.1 s to about 10 seconds. When the metal halide reactant is pulsed to the reaction chamber, a number of pulses can range from about 1 to about 500 or about 10 to about 100. A flowrate of the metal halide reactant during step 104 can be about 50 to about 5000 or about 200 to about 1000 sccm. In accordance with further examples of embodiments, a temperature within the reaction chamber during step 104 can be about 200 to about 600° C. or about 300 to about 500° C. A pressure within the reaction chamber can be between about 1 and about 90 torr or as noted above in connection with step 102.

In additional examples of embodiments, step 104 can comprise cleaning the first surface 204 by exposing the first surface 204 to one or more of a hydrogen-containing gas and an activated species formed therefrom. Exposing the first surface 204 to one or more of the hydrogen-containing gas and activated species formed therefrom can be in addition to or in lieu of exposing the metal halide reactant. A flow of the hydrogen-containing gas and/or activated species formed therefrom can be pulsed or continuous. A duration of exposing the first surface 204 to one or more of a hydrogen-containing gas and an activated species formed therefrom can be about 1 to about 600 or about 10 to about 30 seconds. A flowrate of the hydrogen-containing gas and/or activated species during step 104 can be about 50 to about 5000 or about 1000 to about 4000 sccm.

With reference to FIGS. 1 and 4, method 100 further includes a step of depositing a metal-containing material (such as metal-containing material 414, illustrated in FIG. 4) within the gap 202 to at least partially fill the gap 202 and form a structure 400 (step 106). The metal-containing material 414 can comprise at least one of titanium nitride, molybdenum, ruthenium, tungsten and titanium silicon nitride (TiSiN). Step 106 can comprise depositing the metal-containing material at a temperature between 300° C. and 600° C. A pressure within the reaction chamber can be as noted above in connection with steps 102 and 104.

Figure 5:
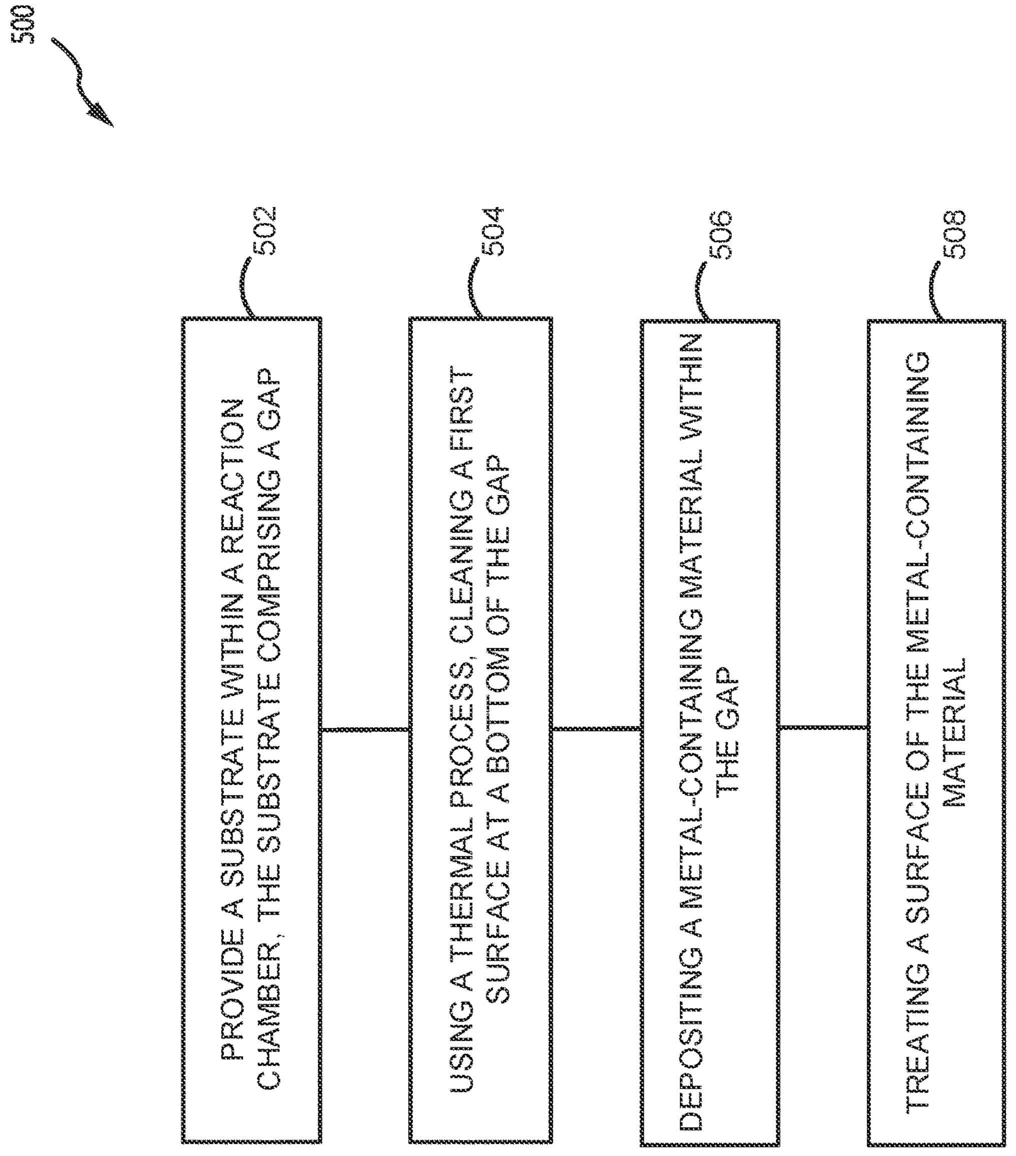
FIG. 5 illustrates a method of forming a structure in accordance with additional exemplary embodiments of the disclosure.

FIG. 5 illustrates another exemplary method 500 for forming a structure using a gap-filling process according to another embodiment of the present disclosure. Method 500 is similar to method 100, except method 500 includes an additional treatment step. FIGS. 6-9 illustrate cross-sectional views of structures at stages of method 500.

Method 500 can begin with step 502, which can involve providing a substrate (such as substrate 600, illustrated in FIG. 6) within a reaction chamber. The substrate 600 can also be a structure. The substrate 600 can be the same or similar to substrate 200 and can comprise a gap (such as gap 602). The gap can further comprise a first surface (such as first surface 604) at a bottom of the gap (such as bottom of the gap 606) and a second surface (such as second surface 608) at a sidewall of the gap (such as sidewall 610).

The first surface 604 of the bottom of the gap 606 can comprise a metal oxide. The metal oxide can comprise at least one of tungsten oxide, molybdenum oxide, titanium oxide, ruthenium oxide (RuOx), TiSiOx and TiSiONx. The bottom of the gap 606 can comprise a metal. The metal can comprise at least one of tungsten, molybdenum, titanium, ruthenium, TiN and titanium silicon nitride (TiSiN). The second surface 608 of the sidewall of the gap 610 can comprise a dielectric material. The dielectric material can comprise at least one of silicon oxide, silicon nitride and silicon oxynitride, SiOC, and SiOCH.

Figures 6, 7, 8, 9:
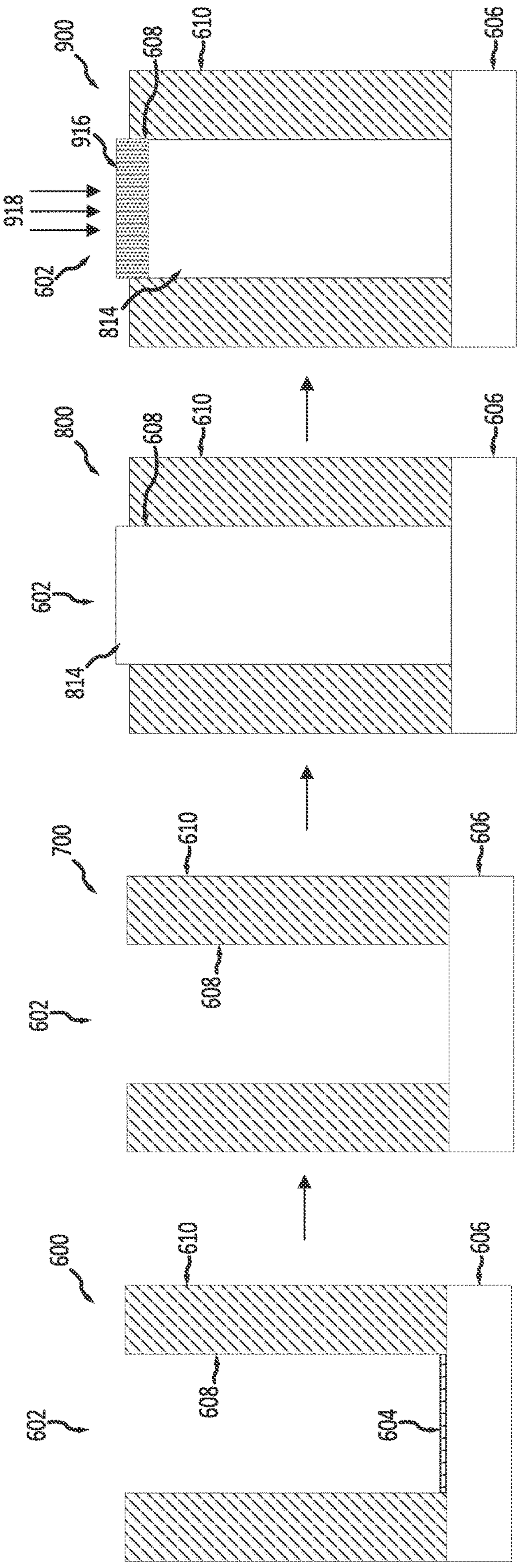
FIGS. 6-9 illustrate cross sectional views of structures at various steps of a gap filling process in accordance with exemplary embodiments of the disclosure.

Method 500 can further include a step 504 of using a thermal process, cleaning a first surface 604 at a bottom of the gap 606 of substrate 600 to form a structure (such as structure 700, illustrated in FIG. 7). Step 504 can be the same or similar to step 104 described above.

With reference to FIGS. 5 and 8, method 500 includes a step of depositing a metal-containing material (such as metal-containing material 814) within the gap 602 to at least partially fill the gap 602 and form a structure (such as structure 800, illustrated in FIG. 8) (step 506). The metal-containing material 814 can comprise at least one of titanium nitride, molybdenum, ruthenium and tungsten. Step 506 can comprise depositing the metal-containing material at a temperature between 300° C. and 600° C. Step 506 can be the same or similar to step 106 described above.

With reference to FIGS. 5 and 9, method 500 includes a step of treating a surface of the metal-containing material 814 to remove oxygen from the surface of the metal-containing material (e.g., at the surface of a metal-containing material 916) to form a structure (such as structure 900, illustrated in FIG. 9) (step 508). Step 508 can remove oxygen from the surface of the metal-containing material 916 via a direct plasma treatment (such as treatment 918). In examples of embodiments, the treatment 918 can comprise a direct plasma treatment as described herein. The direct plasma treatment can comprise providing a hydrogen and nitrogen-containing gas to the reaction chamber. The hydrogen and nitrogen-containing gas can be selected from the group consisting of one or more of a mixture of hydrogen and nitrogen, ammonia, hydrazine, and an alkyl hydrazine.

A pressure of the reaction chamber during the direct plasma treatment 918 can be about 0.5 to about 9.5 or about 1 to about 8 torr. A plasma treatment power during the direct plasma treatment can be about 50 to about 1500 or about 50 to about 700 Watts. A flowrate of the hydrogen and nitrogen-containing gas during the direct plasma treatment can be about 500 to about 3000 or about 500 to about 6000 sccm. In accordance with further examples of embodiments, a substrate temperature within the reaction chamber during the direct plasma treatment can be about 100 to about 400 or about 200 to about 350° C. The direct plasma treatment can comprise a number of cycles of between, for example, about 100 and 500 cycles or 200 and 400 cycles. A duration of the direct plasma treatment can comprise a plasma treatment time between 1 minute and 10 minutes or between 2 minutes and 8 minutes.

According to additional or alternative examples of embodiments, step 508 includes a (e.g., thermal) cyclic process comprising providing (e.g., pulsing) a metal halide to the reaction chamber. In accordance with these exemplary embodiments, the metal halide can comprise at least one of tungsten pentachloride, molybdenum pentachloride, and molybdenum tetrachloride. The cyclic process can comprise a cycle, which can comprise a pulse and a purge. The cyclic process can comprise a pulse period, which is the length of time the metal halide is pulsed into the reaction chamber during the cycle. The cyclic process can also comprise a purge period, which is the amount of time the metal halide is purged from the reaction chamber during the cycle. The pulse period can be about 0.05 to about 60 or about 0.1 to about 10 seconds. The purge period can be about 1 to about 60 or about 1 to about 10 seconds. The cyclic process can comprise a number of cycles, which can be the total number of cycles performed during the cycle process. The number of cycles can be about 1 to about 500 cycles.

Figure 10:
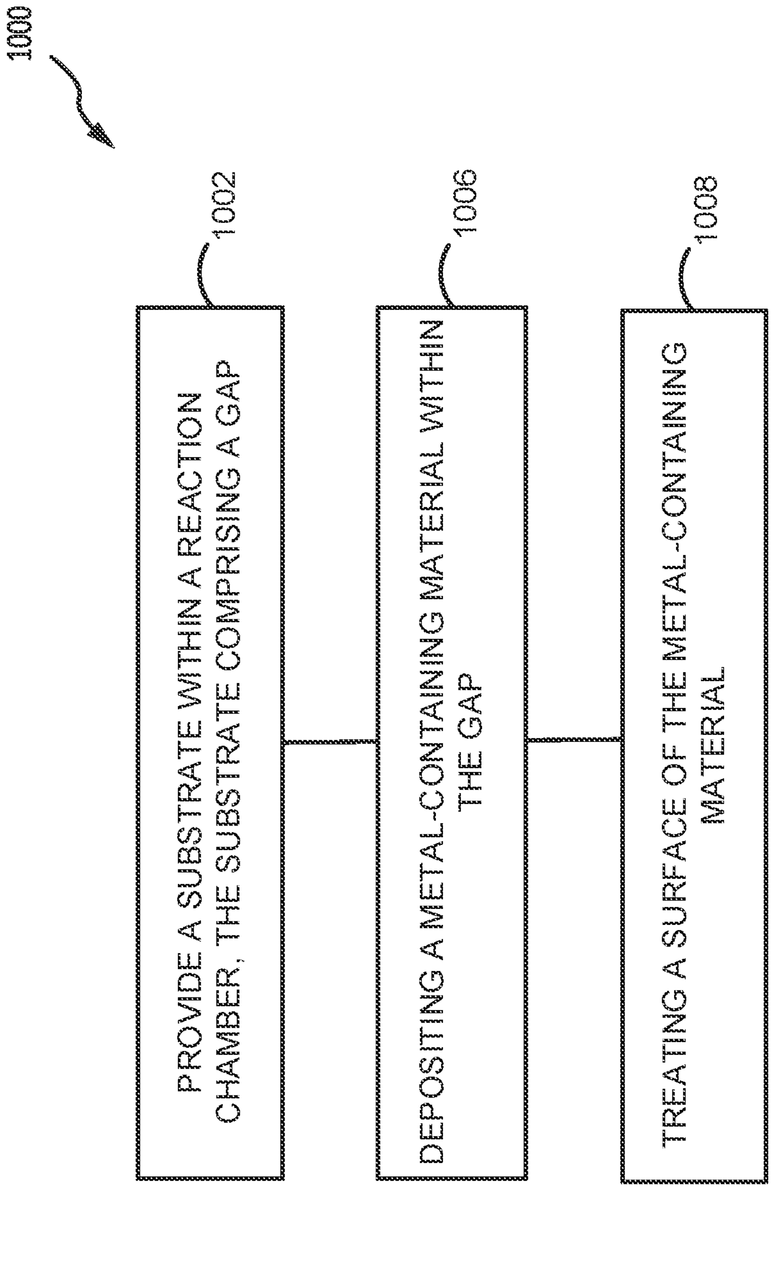
FIG. 10 illustrates a method in accordance with yet further exemplary embodiments of the disclosure.
Figure 13:
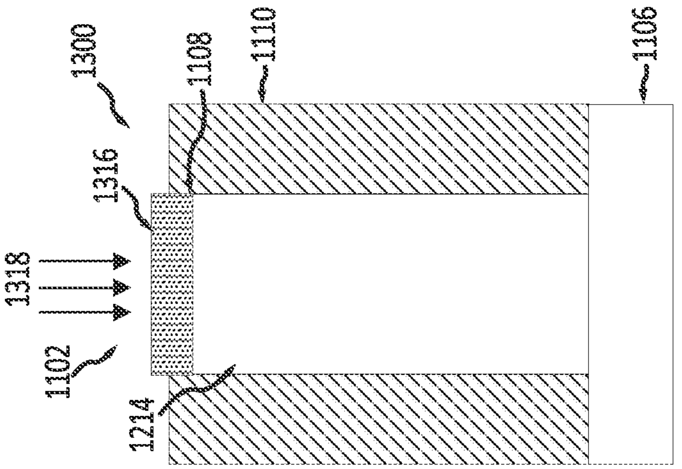
FIGS. 11-13 illustrate cross sectional views of structures at various steps of a gap filling process in accordance with exemplary embodiments of the disclosure.
Figure 12:
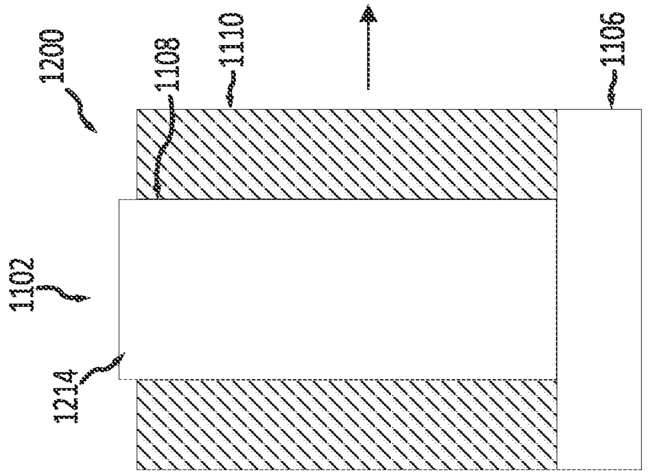
Figure 11:
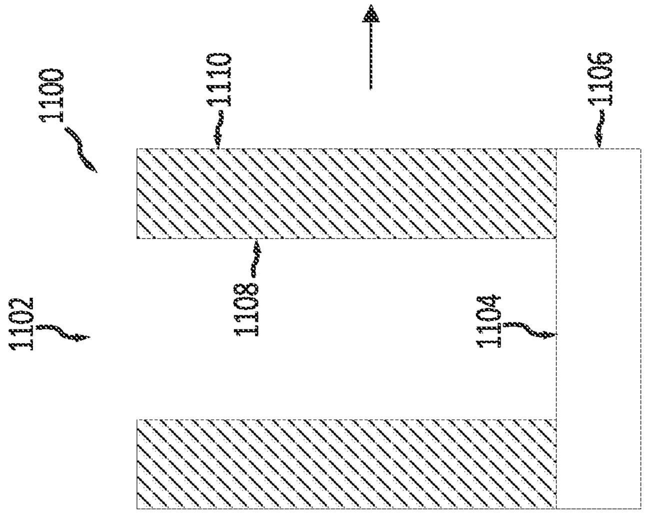

FIG. 10 illustrates another exemplary method 1000 for forming a structure with a gap-filling process according to an embodiment of the present disclosure. FIGS. 11-13 illustrate cross-sectional views of structures at stages of method 1000.

Method 1000 can begin with step 1002, which includes providing a substrate (such as substrate 1100, illustrated in FIG. 11) within a reaction chamber. The substrate 1100 can also be a structure. The substrate can comprise a gap (such as gap 1102). The gap can further comprise a first surface (such as first surface 1104) at a bottom of the gap (such as bottom 1106) and a second surface (such as second surface 1108) at a sidewall of the gap (such as sidewall 1110).

The first surface 1104 of the bottom of the gap 1106 can comprise a metal. The metal can comprise at least one of tungsten, molybdenum, titanium, ruthenium, TiN, and titanium silicon nitride (TiSiN). The second surface 1108 of the sidewall of the gap 1110 can comprise a dielectric material. The dielectric material can comprise at least one of silicon oxide, silicon nitride, silicon oxynitride, SiOC and SiOCH. In some cases, the first surface 1104 can comprise a metal oxide. In accordance with some examples, the metal oxide can be removed using a cleaning step as described above in connection with method 100 and method 500.

A pressure and temperature within a reaction chamber can be as described above in connection with step 102.

Method 1000 includes the step of depositing a metal-containing material (such as metal-containing material 1214) within the gap 1102 to at least partially fill the gap 1102 and form a structure (such as structure 1200, illustrated in FIG. 12) (step 1006). The metal-containing material 1214 can comprise at least one of titanium nitride, molybdenum, tungsten, ruthenium, and titanium silicon nitride (TiSiN). Step 1006 can be the same or similar to step 106 described above.

Additionally, method 1000 can comprise a step of treating a surface of the metal-containing material to remove oxygen from the surface of the metal-containing material (such as the surface of the metal-containing material 1316) to form a structure (such as structure 1300, illustrated in FIG. 13) (step 1008). Step 1008 can remove oxygen from the surface of the metal-containing material 1316 via a direct plasma treatment (such as treatment 1318). In examples of embodiments, the treatment 1318 can comprise a direct plasma treatment as described herein and/or use of a thermal process. Step 1008 can be the same or similar to step 508, described above.

Figure 14:
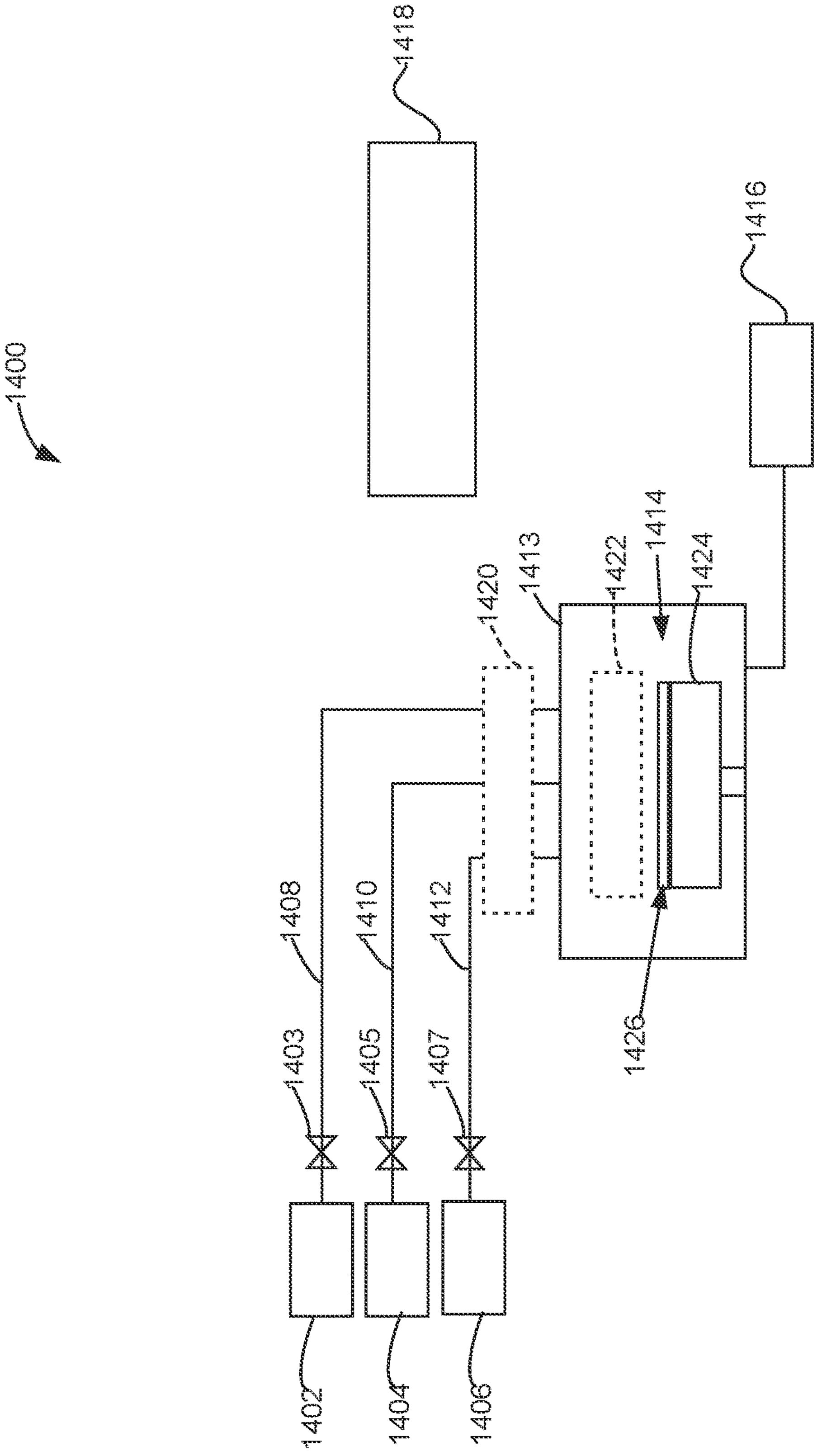
FIG. 14 illustrates a reactor system in accordance with exemplary embodiments of the disclosure.

FIG. 14 illustrates a system 1400 in accordance with yet additional exemplary embodiments of the disclosure. System 1400 can be used to perform a method as described herein and/or form a structure as described herein.

In the illustrated example, system 1400 includes one or more reactors 1413—each including one or more reaction chambers 1414—a first precursor source 1402 in fluid communication via a first flow control valve 1403 with one or more reaction chambers 1414, a reactant source 1404 in fluid communication via a second flow control valve 1405 with one or more reaction chambers 1414, a second precursor source 1406 in fluid communication via a third flow control valve 1407 with one or more reaction chambers 1414, an exhaust source 1416, and a controller 1418. System 1400 can optionally include a remote plasma source 1420 to excite a gas (e.g., during a cleaning or treatment step) from one or more sources 1402-1406 or another gas source.

Reaction chamber 1414 can include any suitable reaction chamber, such as an atomic layer deposition (ALD) or chemical vapor deposition (CVD) reaction chamber. Reaction chamber 1414 can include a gas distribution system 1422, such as a showerhead and a direct plasma electrode, and a susceptor 1424 to retain a substrate 1426.

Exhaust source 1416 can include one or more vacuum pumps to remove gas from the reaction chamber 1414. Substrate 1426 can be any of substrates 200, 600, and 1100. Substrate 1426 can comprise a gap, wherein the gap can comprise a first surface at a bottom of the gap comprising a metal oxide, and a second surface at a sidewall of the gap comprising a dielectric material, as described above. The reaction chamber 1414 can be configured to receive the substrate 1426.

First precursor source 1402 can include a vessel and a precursor for deposition. The precursor can comprise at least one of a titanium, molybdenum, and ruthenium precursor.

Reactant source 1404 can include a vessel and a reactant. The reactant can comprise a metal halide reactant or a hydrogen and nitrogen-containing gas.

Second precursor source 1406 can include one or more second precursors and/or reactants as described herein. For example, second precursor source 1406 can include a reactant to form the metal-containing material as described above. Although illustrated with three gas sources 1402-1406, system 1400 can include any suitable number of gas sources. For example, system 1400 can include a metal halide reactant source, a hydrogen-containing gas source, and/or a hydrogen and nitrogen-containing gas source, each comprising a vessel and a respective reactant therein. Gas sources 1402-1406 can be coupled to reaction chamber 1414 via lines 1408-1412, which can each include flow controllers, flow control valves, heaters, and the like.

Controller 1418 can include electronic circuitry and software to selectively operate flow control valves 1403-1407, manifolds, heaters, pumps, and other components included in system 1400. Such circuitry and components can operate to introduce precursors, reactants, and purge gases from the respective sources 1402-1406. Controller 1418 can control timing of gas pulse sequences, temperature of the substrate and/or reaction chamber, pressure within the reaction chamber, and various other operations to provide proper operation of system 1400. Controller 1418 can include software to electrically or pneumatically operate control flow control valves to provide the precursors from the first precursor source 1402 and the second precursor source 1406, into the one or more reaction chambers 1414. Controller 1418 can include software to electrically or pneumatically control flow control valves to provide the reactant from the reactant source 1404 into the one or more reaction chambers 1414. Controller 1418 can include software to purge gases into and out of the one or more reaction chambers 1414.

Controller 1418 can include modules, such as a software and/or hardware component, e.g., a FPGA or ASIC, which perform certain tasks. A module can advantageously be configured to reside on the addressable storage medium of the control system and be configured to execute one or more processes.

Reaction chamber 1414, in response to the flow control valves 1403-1407, can be configured to receive the reactant to selectively remove a metal oxide from the substrate via a thermal process. Additionally or alternatively, reaction chamber 1414, in response to the flow control valves 1403-1407, can be configured to receive the precursor to deposit a metal-containing material. The metal containing-material can be deposited within the gap to at least partially fill the gap. Additionally or alternatively, reaction chamber 1414, in response to the flow control valves 1403-1407, can be configured to apply a direct plasma treatment to remove oxygen from a surface of the metal-containing material. Reaction chamber 1414 can be responsive to the flow control valves 1403-1407, such that reaction chamber 1414 can be configured to perform the methods 100, 500, and 1000.

Other configurations of system 1400 are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into reaction chamber 1414. Further, as a schematic representation of an apparatus, many components have been omitted for simplicity of illustration; such components may include, for example, various valves, manifolds, purifiers, heaters, containers, vents, and/or bypasses.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming a structure, the method comprising the steps of:

providing a substrate within a reaction chamber, the substrate comprising a gap, the gap comprising a first surface at a bottom of the gap comprising a metal oxide, and a second surface at a sidewall of the gap comprising a dielectric material; and using a thermal process, cleaning the first surface using a metal halide reactant to selectively remove the metal oxide, wherein the cleaning the first surface further comprises exposing the first surface to one or more of a hydrogen-containing gas and an activated species formed therefrom.

2. The method of claim 1 wherein the method further comprises depositing a metal-containing material within the gap to at least partially fill the gap.

3. The method of claim 2, wherein the metal-containing material comprises at least one of titanium nitride, molybdenum, tungsten, ruthenium, and titanium silicon nitride (TiSiN).

4. The method of claim 2, wherein the method further comprises treating a surface of the metal-containing material via a direct plasma treatment.

5. The method of claim 4, wherein using the direct plasma treatment comprises providing a hydrogen and nitrogen-containing gas to the reaction chamber.

6. The method of claim 1, wherein the metal oxide comprises at least one of tungsten oxide, molybdenum oxide, titanium oxide, RuOx, TiSiOx and TiSiONx.

7. The method of claim 1, wherein the dielectric material comprises at least one of silicon oxide, silicon nitride, silicon oxynitride, SiOC and SiOCH.

8. A method of forming a structure, the method comprising the steps of:

providing a substrate within a reaction chamber, the substrate comprising a gap, the gap comprising a first surface at a bottom of the gap and a second surface at a sidewall of the gap;

depositing a metal-containing material within the gap to at least partially fill the gap; and treating a surface of the metal-containing material, wherein the treating comprises applying a direct plasma treatment and providing a hydrogen and nitrogen-containing gas to the reaction chamber.

9. The method of claim 8, wherein the step of depositing the metal-containing material comprises depositing the metal-containing material at a temperature between 300° C. and 600° C.

10. The method of claim 8, wherein the hydrogen and nitrogen-containing gas is selected from the group consisting of one or more of a mixture of hydrogen and nitrogen, ammonia, hydrazine, and an alkyl hydrazine.

11. The method of claim 8, wherein the step of treating comprises a cyclic process comprising pulsing a metal halide to the reaction chamber.

12. The method of claim 11, wherein the step of pulsing the metal halide to the reaction chamber is a thermal process.

13. The method of claim 12, further comprising a step of cleaning the first surface comprising exposing the first surface to one or more of a hydrogen-containing gas and an activated species formed therefrom.

14. The method of claim 8, wherein the metal-containing material comprises at least one of titanium nitride, molybdenum, tungsten, ruthenium, and titanium silicon nitride (TiSiN).

15. The method of claim 13, wherein the first surface at the bottom of the gap comprises a metal oxide selected from the group consisting of tungsten oxide, molybdenum oxide, titanium oxide, RuOx, TiSiOx and TiSiONx.

16. The method of claim 8, wherein the sidewall of the gap comprises a dielectric material selected from the group consisting of silicon oxide, silicon nitride, silicon oxynitride, SiOC, and SiOCH.

17. A method of forming a structure, the method comprising the steps of:

providing a substrate within a reaction chamber, the substrate comprising a gap, the gap comprising a first surface at a bottom of the gap and a second surface at a sidewall of the gap;

cleaning the first surface comprising exposing the first surface to one or more of a hydrogen-containing gas and an activated species formed therefrom;

depositing a metal-containing material within the gap to at least partially fill the gap; and treating a surface of the metal-containing material, wherein the treating the surface comprises a cyclic process comprising pulsing a metal halide to the reaction chamber.

* * * * *